US011966265B2

(12) United States Patent
Robey

(10) Patent No.: US 11,966,265 B2
(45) Date of Patent: Apr. 23, 2024

(54) COOLING ASSEMBLY FOR A COMPUTER MODULE

(71) Applicant: EKWB d.o.o, Komenda (SI)

(72) Inventor: Joe Robey, Derbyshire (GB)

(73) Assignee: EKWB d.o.o. (SI)

( * ) Notice: Subject to any disclaimer, the term of this patent is extended or adjusted under 35 U.S.C. 154(b) by 210 days.

(21) Appl. No.: 17/828,074

(22) Filed: May 31, 2022

(65) Prior Publication Data

US 2022/0382344 A1 Dec. 1, 2022

(30) Foreign Application Priority Data

May 31, 2021 (DE) ...................... 10 2021 114 001.3

(51) Int. Cl.
| | |
|---|---|
| *G06F 1/20* | (2006.01) |
| *G06F 1/18* | (2006.01) |
| *H05K 7/20* | (2006.01) |
| *H01L 23/40* | (2006.01) |

(52) U.S. Cl.
CPC ................ *G06F 1/20* (2013.01); *G06F 1/183* (2013.01); *H05K 7/20* (2013.01); *H01L 23/4006* (2013.01)

(58) Field of Classification Search
CPC .......... H05K 7/12; H05K 7/1407; H05K 7/20; H05K 7/20136; H05K 7/2039; H05K 7/2049; H05K 7/20154; H05K 7/20418; H05K 7/205; H05K 7/20509; H05K 7/20854; H05K 7/20963; H05K 1/02; H05K 1/0201–0204; H05K 1/021; H05K 1/0271; H05K 2201/10409; H05K 2201/10462; H05K 2201/10598; H05K 2201/10606; H01L 23/36–3672; H01L 23/40–4006; H01L 23/4093; H01L 2023/4018; H01L 2023/4037; H01L 2023/405; H01L 2023/4062; H01L 2023/4087; G06F 1/183; G06F 1/20; F16B 21/00; F16B 39/24

See application file for complete search history.

(56) References Cited

U.S. PATENT DOCUMENTS

| | | |
|---|---|---|
| 5,713,690 A | 2/1998 | Corbin, Jr. et al. |
| 10,398,022 B1 | 8/2019 | Li et al. |
| 2004/0132331 A1* | 7/2004 | Osborn ................. H01L 23/552 257/E23.114 |
| 2010/0220447 A1* | 9/2010 | Nie ...................... H01L 23/4006 361/710 |

(Continued)

*Primary Examiner* — Amir A Jalali

(74) *Attorney, Agent, or Firm* — McGarry Bair PC

(57) ABSTRACT

A cooling assembly for a computer module has a cooling device and a mounting device. The mounting device includes a rod shaped fastening element having a male thread and a stop. The fastening element is nonrotatable and movable along its axis with respect to the cooling device. The fastening element is guided through a first hole in the cooling device and a second hole in the computer module, when the cooling device is mounted on the computer module. The stop prevents the fastening element from sliding through the first and second holes. The mounting device also has an elastic element arranged along the axis of the fastening element that presses or pulls the stop away from the computer module. A nut on the mounting device is engageable with the male thread of the fastening element. The stop and the nut are arranged at opposite sides of the computer module.

15 Claims, 8 Drawing Sheets

(56) References Cited

U.S. PATENT DOCUMENTS

| | | | |
|---|---|---|---|
| 2011/0038125 A1* | 2/2011 | Cao | H01L 23/4006 |
| | | | 361/720 |
| 2013/0189049 A1* | 7/2013 | Stotz, Jr. | F16B 5/0266 |
| | | | 411/111 |
| 2013/0250523 A1* | 9/2013 | Lai | H01L 23/4093 |
| | | | 361/720 |
| 2019/0057923 A1* | 2/2019 | Otremba | H02M 7/003 |
| 2020/0352053 A1* | 11/2020 | Mizerak | H01L 23/4735 |

* cited by examiner

COOLING ASSEMBLY FOR A COMPUTER MODULE

CROSS-REFERENCE TO RELATED APPLICATIONS

This application claims priority to Germany application DE 10 2021 114 001.3, filed May 31, 2021.

TECHNICAL FIELD

The invention relates to a cooling assembly for a computer module.

BACKGROUND

Waste heat produced by computer modules is an unavoidable byproduct of any computation. In order for the computer module to function properly, its temperature must be kept within permissible operating temperature limits. It is therefore important to remove excess heat from the computer module by means of a cooling device. Such cooling devices dissipate heat from the computer module by means of a heat sink that is in thermal contact with the computer module. In order to ensure a proper thermal contact, the cooling device must be securely mounted in the computer module.

Cooling devices are typically mounted to a computer module, for example a PCB, by means of multiple standoffs having two male threads. Each standoff is guided through a hole in the PCB into a backplate having a female thread. The cooling device is then placed over the exposed male threads of the standoffs onto a heat source of the computer module. Thumb nuts are engaged with the exposed male threads in order to fasten the cooling device to the computer module. Typically, the heat source is some kind of processor, such as a CPU or a GPU, that is mounted by a socket interface on the computer module.

However, this known type of mounting has several disadvantages. In particular, it is difficult to achieve a consistent and controlled amount of mounting force. Each socket interface has a specified maximum mounting force and for the cooling device to operate efficiently it is desirable to meet this value. Exceeding the maximum mounting force however may lead to permanent damage or intermittent function. The mounting force exerted by a thumb nut depends heavily on how tight the nut was pulled. Since tightening the nut is usually done by an end user, a manufacturer typically has no control over the mounting force. Having multiple threads can lead to components being over tightened under tightened or cross threaded resulting in the components locking together. Where a hard stop is implemented on a threaded part to prevent overtightening these components can often become locked together when the thread reaches its limit making removal of the cooling device precarious. This can lead to damage of the PCB and/or the cooling device and makes repeated assembly/disassembly difficult. Provisioning space to access the mounting components by hand or by tools compromises the size and form of the cooling device. Other components surrounding the cooling device can also obstruct installation/removal of the thumb nuts or the standoffs, and hence the cooling device. Additionally, parts such as thumb nuts and standoffs, which rotate on a surface of the PCB can lead to damage of electrical traces. Further, the aforementioned mounting components detract from the visual appearance of the cooling device.

SUMMARY

It is an object of the present invention to provide a cooling assembly comprising means which enable a cooling device to be mounted to a computer module with a controlled and consistent mounting force which are both fast and easy to use.

The aforementioned objects is achieved by the subject matter of the independent claim. Advantageous embodiments are defined in the dependent claims and the following description.

A cooling assembly for a computer module comprises a cooling device configured to thermally contact a heat source of the computer module, and to dissipate heat from said heat source, and a mounting device for mounting the cooling device on the computer module. The mounting device comprises at least one rod shaped fastening element having a male thread and a stop. The fastening element is nonrotatable and movable along its axis with respect to the cooling device. The fastening element is guided through a first hole in the cooling device and a second hole in the computer module, when the cooling device is mounted on the computer module. The stop prevents the fastening element from sliding through the first and second holes. The mounting device also comprises at least one elastic element being arranged along the axis of the fastening element and configured to press or to pull the stop away from the computer module, when the cooling device is mounted on the computer module. Further, the mounting device comprises at least one nut being engageable with the male thread of the fastening element. The stop and the nut are arranged at opposite sides of the computer module, when the cooling device is mounted on the computer module.

The cooling device is fastened to the computer module by means of the fastening element and the nut. Neither the stop nor the nut can move through the first and second holes. Thus, when the nut is tightened, the stop and the nut exert mounting forces acting from opposite sites onto the cooling device and the computer module. Thereby, the cooling device and the computer module are pressed together. In order to control the amount of mounting force exerted on the cooling device and the computer module, the mounting device is provided with the elastic element. The elastic element is pretensioned such that the fastening element is either pressed or pulled through the first and second holes and away from the computer module. Thereby, the nut is pulled towards the computer module. Since the force exerted by the elastic element is consistent, i.e. typically proportional to its change in length, the nut is pulled towards the computer module with a consistent force as well. This results in a mounting force that is consistent even with repeated assembly/disassembly. Only a single thread comprising the male thread of the fastening device and the female thread of the nut is used, which means that the mounting device cannot accidentally be locked together. Since the fastening element cannot rotate with respect to the cooling device, the nut can easily be tightened without the need for applying torque to the fastening element. This means that the nut can be easily applied with one hand only and without additional tools. This is fast and especially useful in tight spaces such as the inside of a computer. Thus, the mounting device provides means for fastening the cooling device to the computer module with a controlled and consistent mounting force that is both fast and easy to use. Additionally, because the elastic element is pretensioned, the fastening element cannot fully retract inside the cooling device. Thus, the fastening element always extends sufficiently to engage with the nut on the opposite side of the computer module.

The computer module may in particular be a PCB. The heat source may be a processor such as a CPU or GPU, a memory element, such as a RAM element, or any other heat producing element of the computer module.

In a preferred embodiment, the cooling device and the nut are arranged at opposite sides of the computer module, when the cooling device is mounted on the computer module. In this embodiment, the nut is not obstructed by the cooling device and thus easy to access.

In another preferred embodiment, the stop of the fastening element and the elastic element are completely received in a body of the cooling device. Since the fastening element and the elastic element need not be accessed, they can be hidden inside the cooling device. This allows elements of the cooling device, e.g. heat pipes, to be arranged with no regard for access to the fastening element. Thus, the cooling device can be made more efficient. Further, hiding the fastening element and the elastic element may result in an aesthetically pleasing appearance desirable for certain consumer grade cooling assemblies.

In another preferred embodiment, the mounting device further comprises a back plate. The back plate has at least one hole. The fastening element is also guided through the hole of the back plate, when the cooling device is mounted on the computer module. The back plate and the cooling device are arranged on opposite sides of the computer module, when the cooling device is mounted on the computer module. The back plate prevents excessive deflection of the computer module due to the mounting force of the mounting device. Further, the backplate provides additional stability to the cooling assembly.

In another preferred embodiment, the back plate is arranged between the nut and the computer module, when the cooling device is mounted on the computer module. In this embodiment, the back plate additionally acts as a washer plate that prevents direct contact between the nut and the computer module. Thereby, the nut can be tightened with more force resulting in a more secure mount without damage to the computer module.

In another preferred embodiment, the elastic element is arranged between the stop of the fastening element and the first hole. The elastic element is pretensioned against the stop and the cooling device. In this embedment, the computer module is arranged between the cooling device and the nut. The fastening element is pressed away by the elastic element from the first hole in the cooling device, thereby pulling the nut threaded onto the male thread towards the computer module. This presses the cooling device and the computer module together. Since the mounting force acting on the computer module is exerted directly by the elastic element, the mounting force can be precisely controlled.

In an alternative embodiment, the elastic element is arranged between the stop of the fastening element and the hole in the back plate. The elastic element is pretensioned against the stop and the back plate. In this embedment, the cooling device and the nut are arranged on the same side of the computer module. The mounting force exerted by the elastic element is acting on the back plate, preventing a direct contact between the elastic element and the computer module. Thereby, a stiffer elastic element may be used, which exerts more force resulting in a more secure mount without damaging the computer module.

In another preferred embodiment, the mounting device comprises a second stop. The movement of the fastening element along its axis is limited by the first and second stops. This fixes the fastening element to the cooling device, resulting in greater ease of use due to less parts that need to be installed in a potentially cramped space. The second stop may also be used to keep the elastic element in a compressed or extended state, so that it is pretensioned. The elastic element is pretensioned in order to reduce the necessary engagement of the nut to achieve a suitable mounting force for the cooling device.

In another preferred embodiment, the mounting device further comprises a distancer threaded onto the fastening element. The distancer and the nut are arranged on opposite sides of the computer module, when the cooling device is mounted on the computer module. In particular, the distancer comprises no female threading. The distancer prevents the elastic element from being compressed or stretched too much, thereby preventing the mounting device from being overtightened. Further, the distancer acts like a washer plate preventing damage to the computer module. In an alternative embodiment, the distancer may be formed by the fastening element itself, e.g. as an additional stop.

In another preferred embodiment, the mounting device further comprises a washer plate arranged along the axis of the fastening element. The washer plate is arranged between the nut and the computer module, when the cooling device is mounted on the computer module. The washer plate prevents direct contact between the nut and the computer module or the back plate. Thereby, the nut can be tightened with more force resulting in a more secure mount without damaging the computer module or the back plate respectively.

In another preferred embodiment, the fastening element has a section that engages with a portion of the cooling device in order to prevent the fastening element from rotating. In particular, the section of the fastening element has a cross section which is not round but, for example, rectangular or flattened. The portion may be the first hole of the cooling device. In particular, the cross section of the first hole may be formed similar to the cross section of the section, e.g. also rectangular or flattened.

Preferably, the fastening element is a screw or bolt. Screws and bolts are readily available in various sizes and shapes, thus eliminating the need for additional machining tools. This makes the overall cooling assembly cost effective to manufacture.

In a preferred embodiment, the nut is a thumb nut. Thumb nuts comprise a knurled surface around their circumference allowing a better grip on the thumb nut than on a nut with a smooth surface. This means, that the nut can easily be tightened by hand without the need for any tools. Thereby, the cooling assembly is even more easy to install. Further, a thumb nut cannot be engaged with tools, limiting the torque which can be applied to it.

In particular, the elastic element is a coil spring or a leaf spring. Coil and leaf springs are simple and readily available elastic elements with suitable properties. Alternatively, the elastic element may also be a spring made from an elastomer such a rubber or any other suitable material.

In a preferred embodiment, the mounting device comprises at least two, three or four fastening elements. The mounting device further comprises an elastic element and a nut for each fastening element. In this embodiment, the cooling device is mounted on the computer module at two or more points, thereby increasing the overall stability of the cooling assembly.

BRIEF DESCRIPTION OF THE DRAWINGS

Hereinafter, a specific embodiment is described referring to the drawings, wherein.

DETAILED DESCRIPTION

Figure 1:
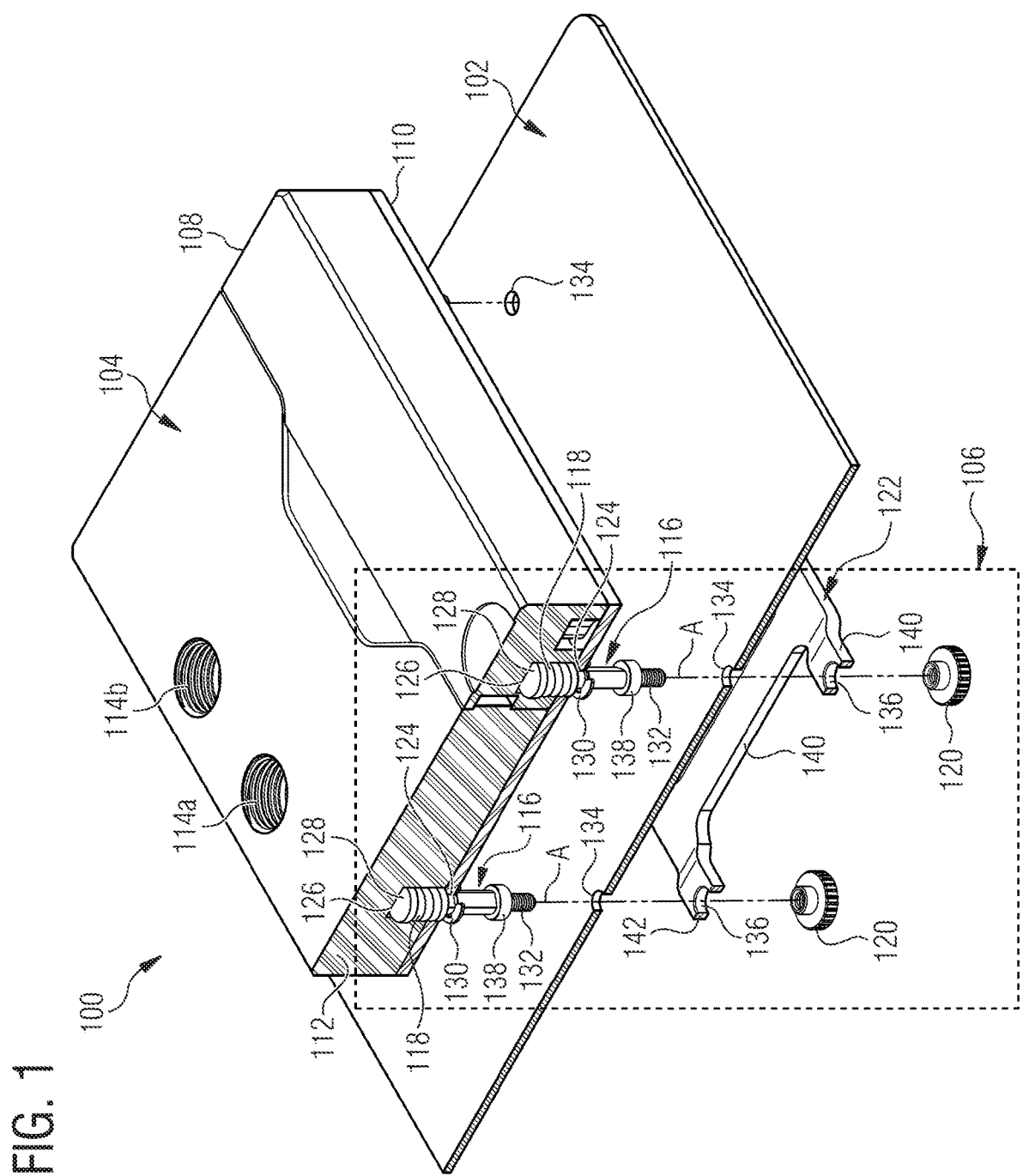
FIG. 1 is a perspective cutaway view of a cooling assembly for a computer module in an unmounted state.

FIG. 1 is a perspective cutaway view of a cooling assembly 100 for a computer module 102 in an unmounted state. The cooling assembly 100 comprises a cooling device 104 arranged atop the computer module 102 and a mounting device 106 for mounting the cooling device 104 to the computer module 102.

Figure 2:
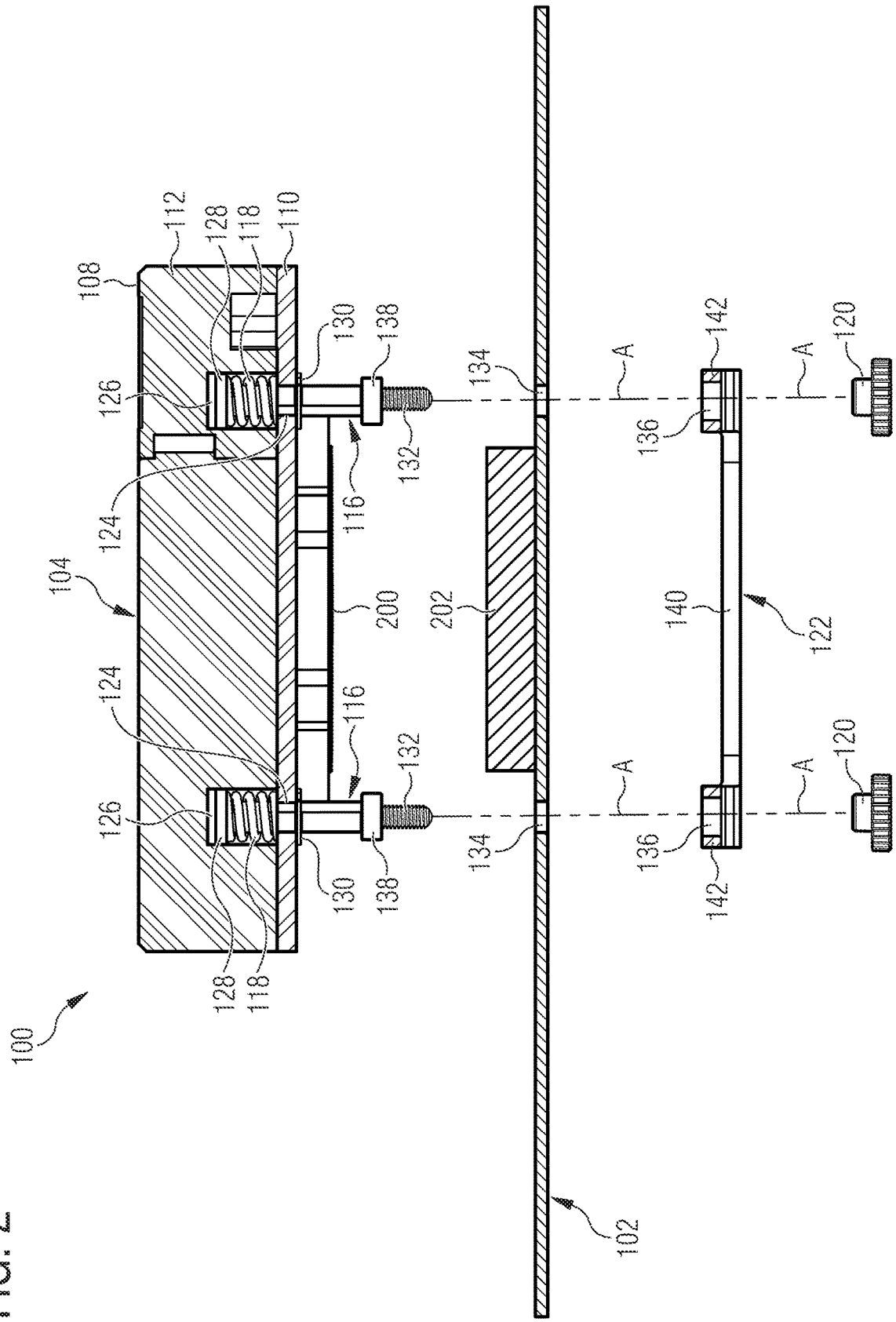
FIG. 2 is a front view cutaway of the cooling assembly in the unmounted state.

The cooling device 104 is exemplary formed as a liquid cooling device and comprises a body 108 arranged on a base plate 110. The base plate 110 is brought into thermal contact with a heat source 202 of the computer module 102 (c.f. FIG. 2), e.g. a processor such as a CPU or a GPU, when the cooling assembly 100 is in a mounted state. The body 108 of the cooling device 104 comprises a heat sink arrangement 112 in thermal contact with the base plate 110. Since the cooling device 104 is a liquid cooling device 104, the heat sink arrangement 112 is also called a cold plate. The body 108 further comprises an inlet port 114a and an outlet port 114b that allow a liquid coolant to enter and exit the body 108, respectively. The liquid coolant is directed to flow around the heat sink arrangement 112 in order to remove excess heat.

The mounting device 106 comprises four sets of rod shaped fastening elements 116, elastic elements 118, and nuts 120, of which only two are shown in FIG. 1. The mounting device 106 further comprises a back plate 122 arranged below the computer module 102, i.e. opposite the cooling device 104.

The fastening elements 116 are guided through first holes 124 in the base plate 110 of the cooling device 104. A top part of each fastening element 116 is partially received a blind hole 126 in the body 108 of the cooling device 104 above the first hole 124. The blind hole 126 guides the fastening element 116 such that it can only be moved along an axis A of the fastening element 116. Each fastening element 116 comprises a first stop 128 arranged on top of the fastening element 116 and received in the blind hole 126. The first stop 128 prevents the fastening element 116 from sliding through the first hole 124. Thereby, the fastening element 116 cannot fall out of the blind hole 126.

The elastic element 118, exemplary shown to be a coil spring, is arranged along the axis A of the fastening element 116 inside the blind hole 126 between the first hole 124 and the first stop 128. The elastic element 118 is pretensioned against the base plate 110 of the cooling device 104 and the first stop 128 such that the first stop 128 is pressed away from the base plate 110. Thereby, the fastening element 116 is pulled through the first hole 124 and away from the base plate 110. A second stop 130 of the fastening element 116 is arranged below the first hole 124, i.e. opposite of the elastic element 118 and the first stop 128. The second stop 130, like the first stop 128, prevents the fastening element 116 from sliding through the first hole 124, thereby limiting the movement of the fastening element 116 along its axis A. Further, the second stop 130 prevents the elastic element 118 from extending too much, thereby keeping it in a compressed state, i.e. pretensioned.

Alternatively, the elastic element 118 may be a leaf spring that is deformed toward or away from the base plate 110. In another alternative embodiment, the elastic element 118 may be arranged such that it is stretching away from the cooling device 104 and towards the computer module 102.

Each fastening element 116 comprises a male thread 132 at an end opposite to the first stop 128. The male thread 132 is guided through second holes 134 in the computer module 102, and third holes 136 in the back plate 122 in this order, when the cooling device 104 is mounted to the computer module 102. Each fastening element 116 further comprises a distancer 138 arranged atop the male thread 132. The distancer 138 prevents the fastening element 116 from sliding through the second and third holes 134, 136. The nut 120 can be engaged with the male thread 132 and tightened in order to fasten the cooling device 104 to the computer module 102. The nuts 120 shown in FIG. 1 are exemplary formed as thumb nuts having knurled surface. The mounting process will be explained in more detail below with reference to FIGS. 3 and 4.

The back plate 122 comprises a plate body 140 having four arms 142 that are bend upwards. Only two of the arms 142 are shown in FIG. 1. The arms 142 comprise the four third holes 136, through which the male thread 132 is guided, when the cooling device 104 is mounted on the computer module 102. The arms 142 are bend upwards in order to prevent the plate body 140 from contacting the computer module 102 and thus to prevent damage to the computer module 102.

FIG. 2 is a front view cutaway of the cooling assembly 100 in the unmounted state. As can be seen in FIG. 2, the cooling device 104 comprises a contact plate 200 arranged below the base plate 110. When the cooling device 104 is mounted on the computer module 102, the contact plate 200 ensures the thermal contact between the heat source 202 and the cooling device 104. FIG. 2 also shows the arms 142 of the back plate 122 being bend upwards.

Figure 3:
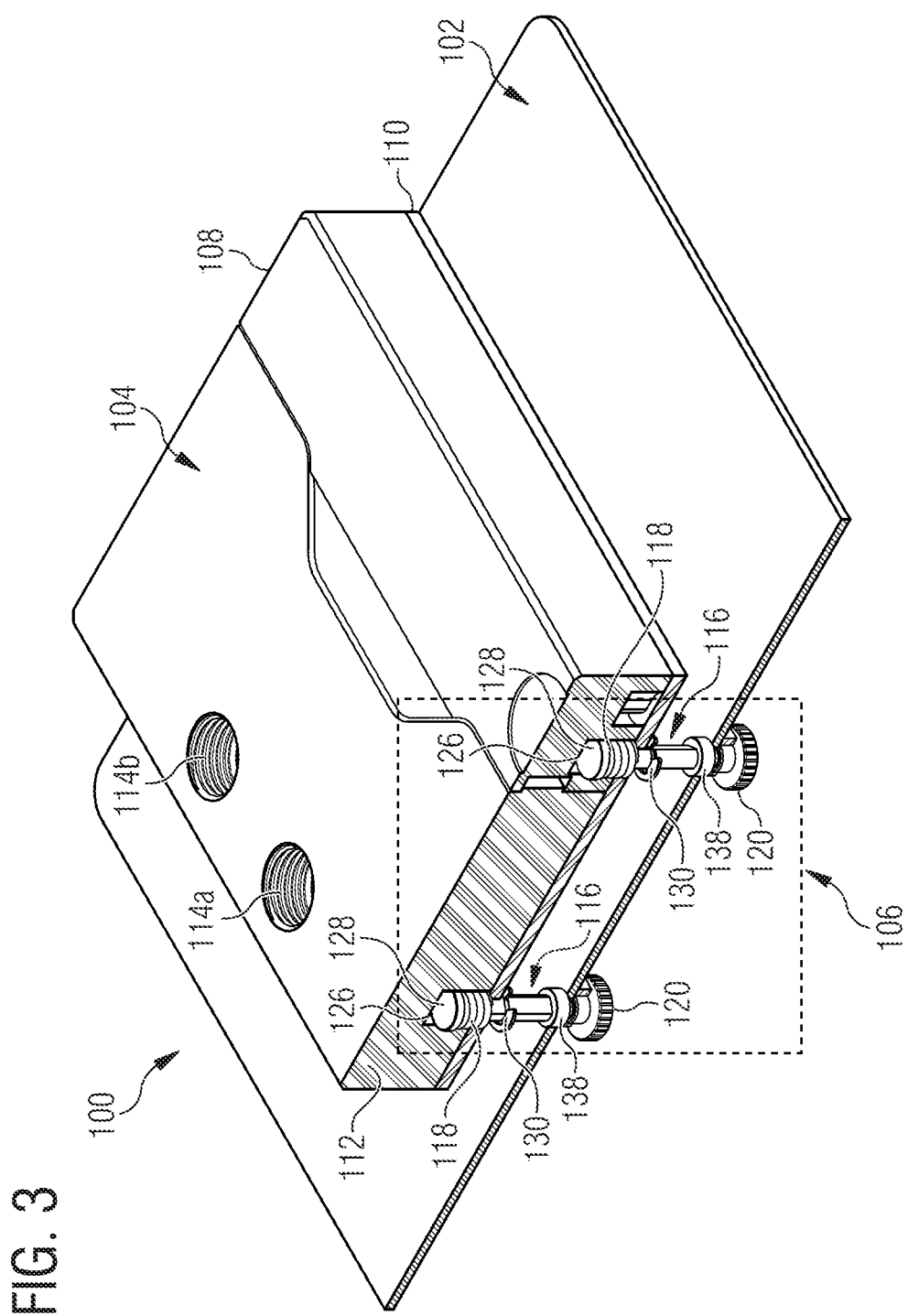
FIG. 3 is a perspective cutaway view of the cooling assembly in a mounted state.

FIG. 3 is a perspective cutaway view of the cooling assembly 100 in a mounted state. In the mounted state the cooling device 104 is fastened to the computer module 102 by the fastening element 116 and the nut 120.

The nut 120 is engaged with the male thread 132 and tightened against the distancer 138 of the fastening element 116. This presses the back plate 122 from the bottom against the computer module 102. Thereby, the fastening element 116 is securely fixed to the computer module 102. This means that the first stop 128 of the fastening element 116 cannot move with respect to the computer module 102. Since the elastic element 118 is pretensioned against the first stop 128 and the base plate 110 of the cooling device 104, the base plate 110, and thus the cooling device 104 are pushed down towards the computer module 102 by the elastic element 118. Since the force exerted by the elastic element 118 is predictable and consistent, the force with which the cooling device 104 is pressed onto the computer module 102 is also predictable and consistent. The force exerted by the elastic element 118 118, which is exemplary formed as a coil spring, is approximately proportional to its change in length. This means that the mounting force is predetermined by the distance between the first stop 128 and the base plate 110 in the mounted state of the cooling assembly 100. The mounting force is also determined by the thickness of the distancer 138.

Figure 4:
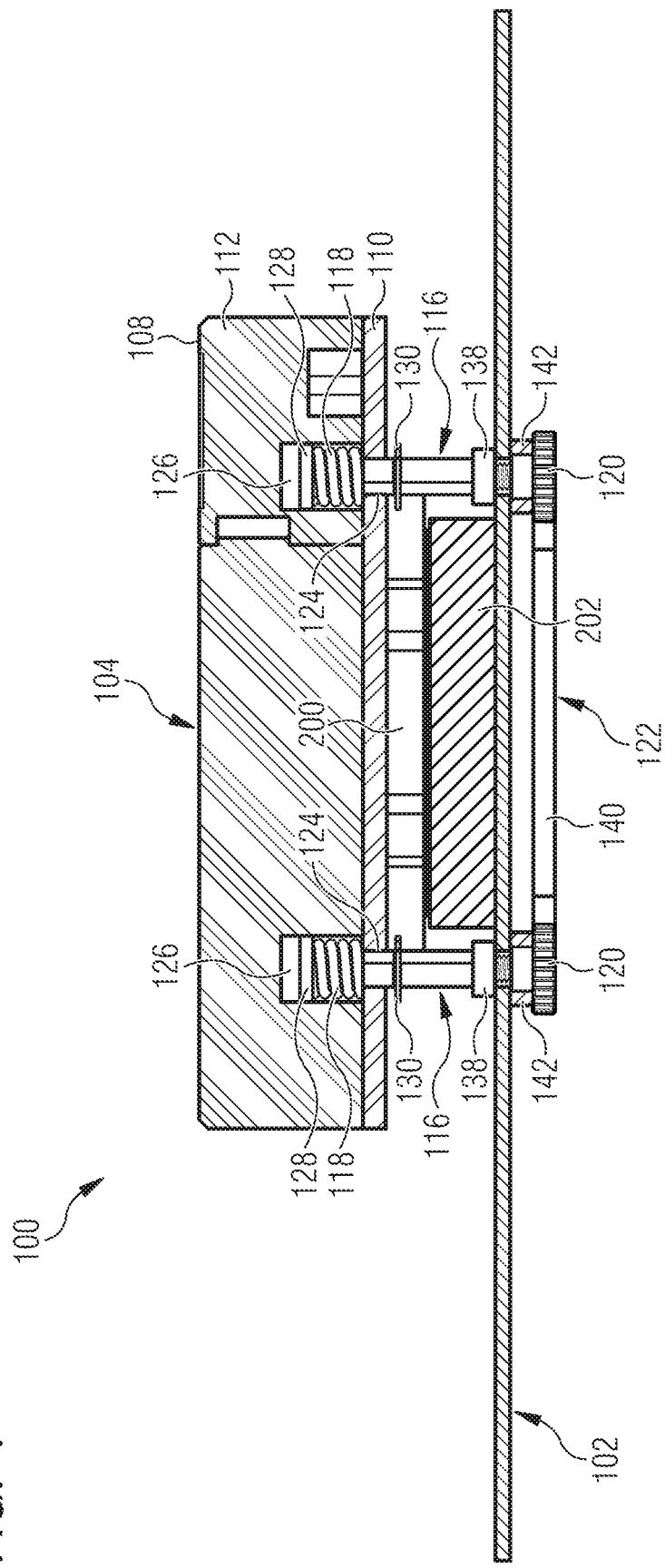
FIG. 4 is a front view cutaway of the cooling assembly in the mounted state.

FIG. 4 is a front view cutaway of the cooling assembly 100 in the mounted state. In the mounted state, the contact plate 200 is in thermal contact with the heat source 202 of the computer module 102. The contact plate 200 is pressed against the top of the heat source 202 as is described above with reference to FIG. 3. Since the mounting force pressing the contact plate 200 onto the heat source 202 is consistent, optimal thermal contact can be ensured. As can be seen in FIG. 4 the elastic element 118 is arranged such, that it is not compressed to its solid length, when the cooling assembly 100 is in its mounted state. This prevents the cooling assembly 100 from being over tightened. Because the movement of the fastening element 116 is small relative to the cooling device 104 it is unlikely to apply pressure unevenly.

Figure 5:
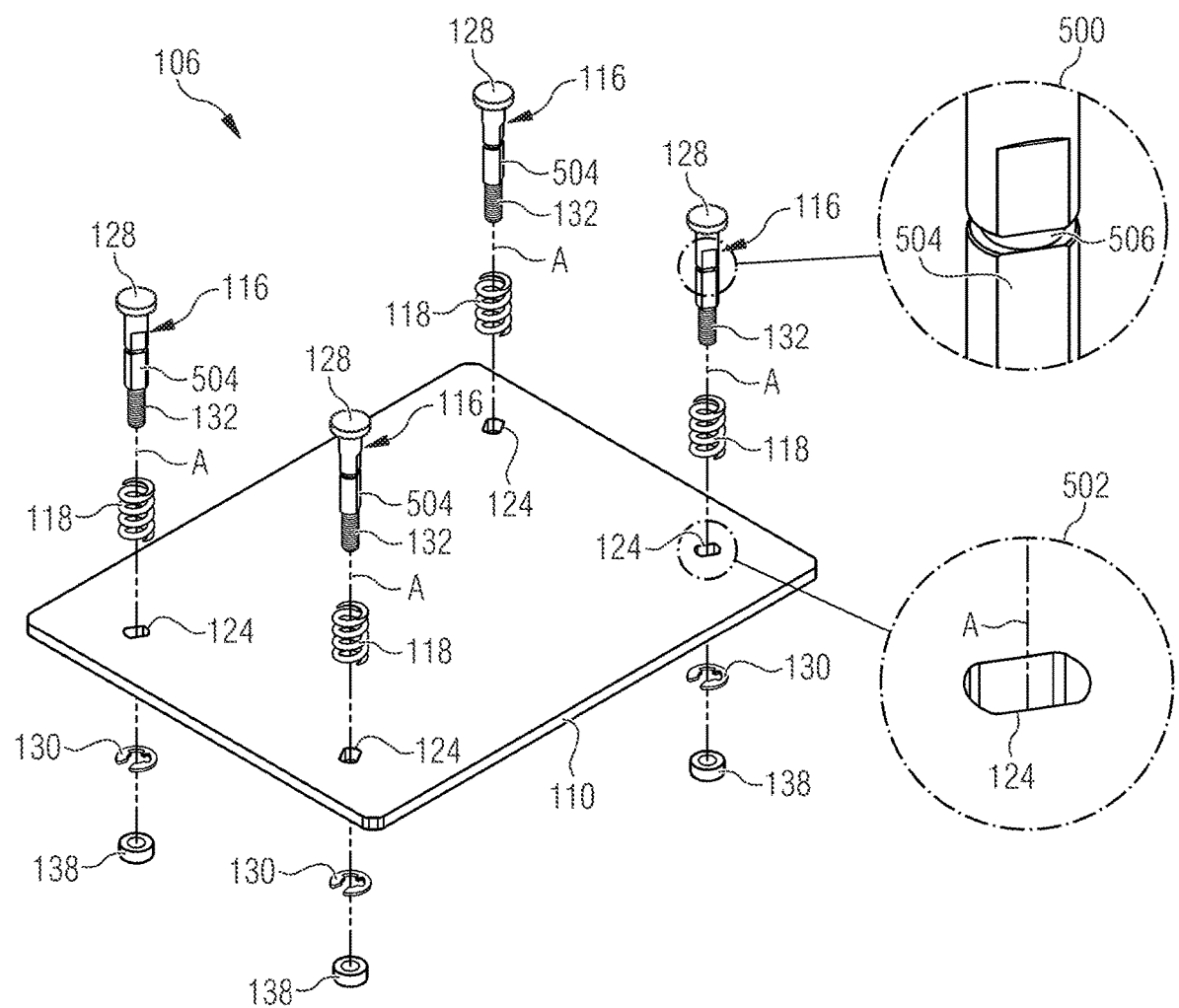
FIG. 5 is a perspective view of the mounting device and the base plate of the cooling device in a disassembled state.

FIG. 5 is a perspective view of the mounting device 106 and the base plate 110 of the cooling device 104 in a disassembled state. FIG. 5 also includes two detail views 500, 502 of one of the fastening elements 116 and one of the first holes 124 of the base plate 110, respectively.

Figure 7:
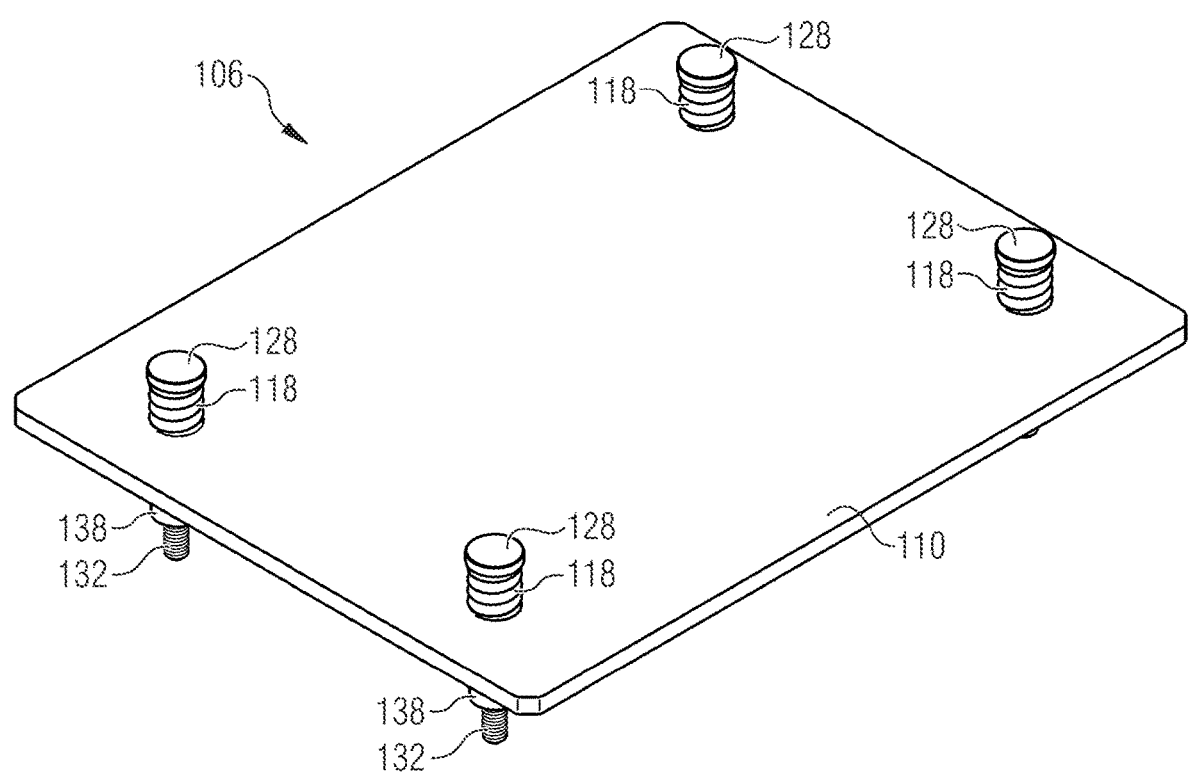
FIG. 7 is a perspective view of the mounting device and the base plate of the cooling device in an assembled state.
Figure 8:
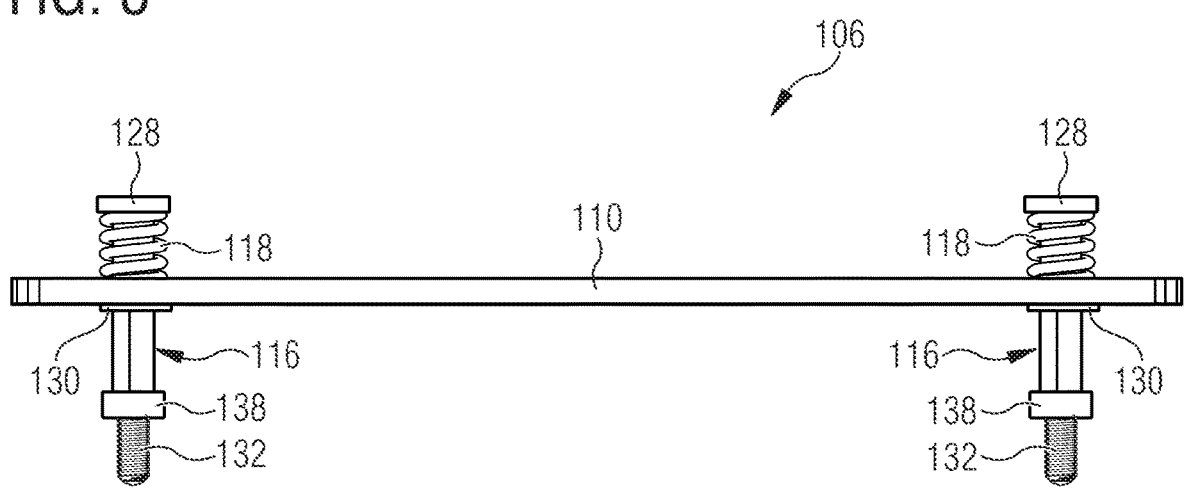
FIG. 8 is a front view of the mounting device and the base plate of the cooling device in the assembled state.

The fastening element 116 is exemplary formed as a screw or bolt. As can be seen in FIG. 5, the fastening elements 116 have sections 504 along their shanks that are flattened, i.e. where the cross section of each fastening element 116 is not circular but a circle flattened at two opposing sides. The flattened section 504 is interrupted by a circumferential recess 506 shown in the first detail view 500. When the mounting device 106 is in an assembled state (c.f. FIGS. 7 and 8), the second stop 130 is clipped into the circumferential recess 506 in order to fix it to the fastening element 116. The position of the circumferential recess 506 along the axis of the fastening element 116 determines the amount the elastic element 118 is pretensioned, when the mounting device 106 is in its assembled state.

The first hole 124 is shown in the second detail view 502. As can be seen from the second detail view 502, the first holes 124 have a cross section that matches the cross section of the flattened sections 504 of the fastening elements 116, i.e. a circle flattened at opposing sides. This means, when the mounting device 106 is in the assembled state, i.e. when the fastening device is guided through the first hole 124, the flattened section 504 engages with the cross section of the first hole 124 and prevents the fastening device from rotating in the first hole 124.

In this embodiment, the distancer 138 is formed as a circular element with a through hole without a female thread that is threaded onto the fastening element 116. Preferably, the distancer 138 is made from an elastic material. This prevents damage to the computer module 102, since the distancer 138 is tightened against the computer module 102, when the cooling assembly 100 is in its mounted state. The distancer 138 is made from a rigid material. The distancer 138 is flat and blunt such that excessive force applied to the nut 120 will only compress the computer module 102, avoiding scratches or puncturing the surface.

Figure 6:
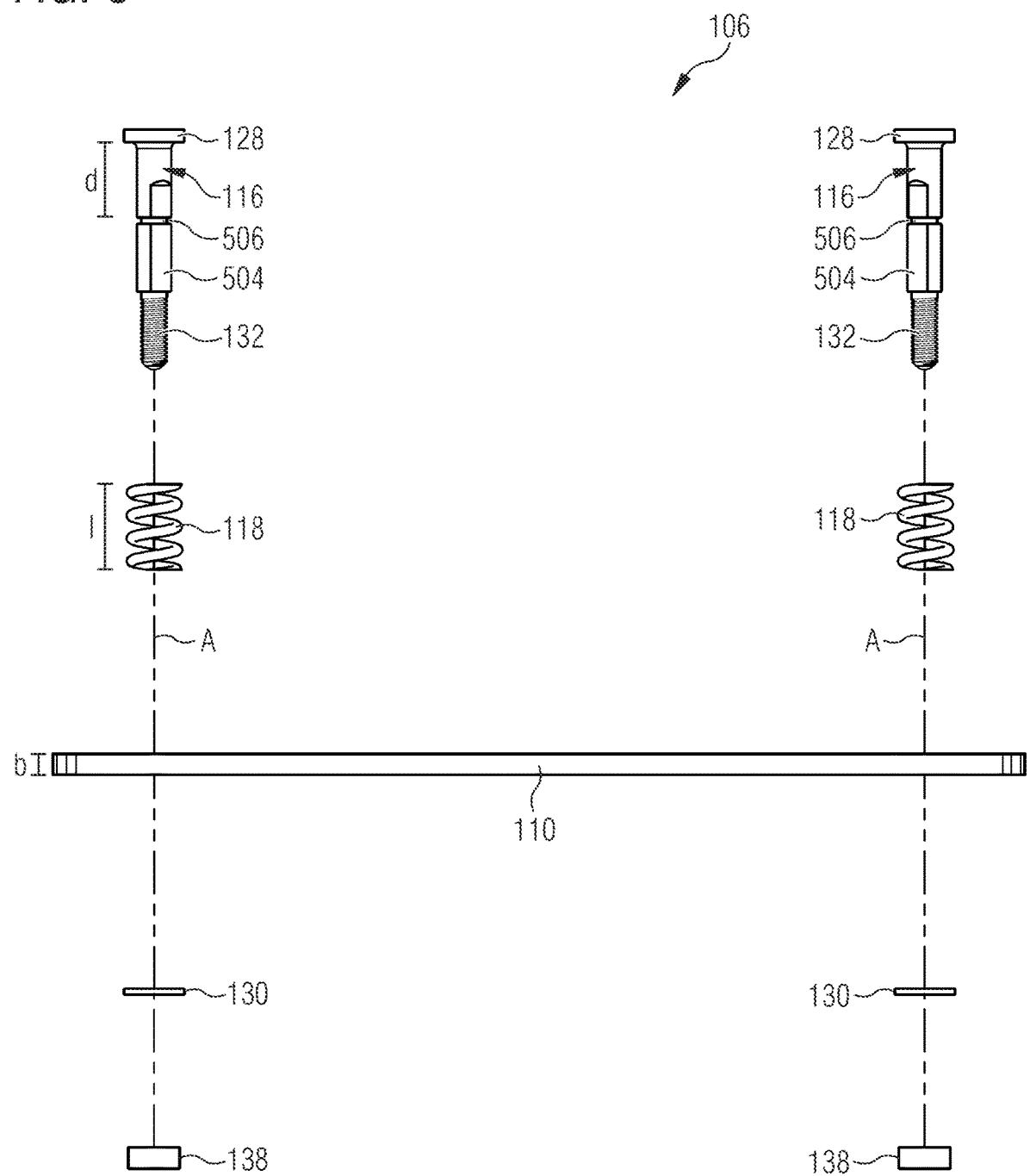
FIG. 6 is a front view of the mounting device and the base plate of the cooling device in the disassembled state.

FIG. 6 is a front view of the mounting device 106 and the base plate 110 of the cooling device 104 in the disassembled state. As can be seen in FIG. 6, the distance d between the first stop 128 and the circumferential recess 506 of each fastening element 116 is slighter shorter than the length l of the elastic elements 118. The elastic element 118 is further compressed by the thickness b of the base plate 110 (c.f. FIG. 8). This ensures that the elastic element 118 is pretensioned, when the mounting device 106 is in its assembled state.

FIG. 7 is a perspective view of the mounting device 106 and the base plate 110 of the cooling device 104 in the assembled state. In the assembled state, the fastening elements 116 are guided through their respective first holes 124. The elastic elements 118 are compressed and pretensioned against the first stops 128 and the base plate 110 of the cooling device 104. The distancers 138 are threaded onto the male thread 132 of the fastening elements 116.

FIG. 8 is a front view of the mounting device 106 and the base plate 110 of the cooling device 104 in the assembled state. As can be seen in FIG. 8, the second stops 130 are clipped into the circumferential recesses 506, thereby preventing the fastening elements 116 from sliding through the first holes 124 in the base plate 110 due to the force exerted by the compressed elastic elements 118. The distancers 138 are threaded up to the top of the male thread 132 of the fastening element 116.

Identical or similarly acting elements are designated with the same reference signs in FIGS. 1 to 8.

What is claimed is:

1. Cooling assembly for a computer module, comprising
a cooling device configured to thermally contact a heat source of the computer module, and to dissipate heat from said heat source; and
a mounting device for mounting the cooling device on the computer module, comprising
at least one rod shaped fastening element having a male thread and a stop, the fastening element being nonrotatable and movable along its axis with respect to the cooling device, wherein the fastening element is guided through a first hole in the cooling device and a second hole in the computer module, when the cooling device is mounted on the computer module, and wherein the stop prevents the fastening element from sliding through the first and second holes;
at least one elastic element being arranged along the axis of the fastening element and configured to press or to pull the stop away from the computer module, when the cooling device is mounted on the computer module; and
at least one nut being engageable with the male thread of the fastening element, wherein the stop and the nut are arranged at opposite sides of the computer module, when the cooling device is mounted on the computer module.

2. Cooling assembly according to claim 1, wherein the cooling device and the nut are arranged at the opposite sides of the computer module, when the cooling device is mounted on the computer module.

3. Cooling assembly according to claim 1, wherein the stop of the fastening element and the elastic element are completely received in a body of the cooling device.

4. Cooling assembly according to claim 1, wherein the mounting device further comprises a back plate; wherein the back plate has at least one hole; wherein the fastening element is also guided through the hole of the back plate, when the cooling device is mounted on the computer module; and wherein the back plate and the cooling device are arranged on the opposite sides of the computer module, when the cooling device is mounted on the computer module.

5. Cooling assembly according to claim 4, wherein the back plate is arranged between the nut and the computer module, when the cooling device is mounted on the computer module.

6. Cooling assembly according to claim 4, wherein the elastic element is arranged between the stop of the fastening element and the hole in the back plate; and wherein the elastic element is pretensioned against the stop and the back plate.

7. Cooling assembly according to claim 1, wherein the elastic element is arranged between the stop of the fastening element and the first hole; and wherein the elastic element is pretensioned against the stop and the cooling device.

8. Cooling assembly according to claim 1, wherein the mounting device comprises a second stop; and wherein the movement of the fastening element along its axis is limited by the first and second stops.

9. Cooling assembly according to claim 1, wherein the mounting device further comprises a distancer threaded onto the fastening element; and wherein the distancer and the nut are arranged on the opposite sides of the computer module, when the cooling device is mounted on the computer module.

10. Cooling assembly according to claim 1, wherein the mounting device further comprises a washer plate arranged along the axis of the fastening element; and wherein the washer plate is arranged and between the nut and the computer module, when the cooling device is mounted on the computer module.

11. Cooling assembly according to claim 1, wherein the fastening element has a section that that engages with a portion of the cooling device in order to prevent the fastening element from rotating.

12. Cooling assembly according to claim 1, wherein the fastening element is a screw or bolt.

13. Cooling assembly according to claim 1, wherein the nut is a thumb nut.

14. Cooling assembly according to claim 1, wherein the elastic element is a coil spring or a leaf spring.

15. Cooling assembly according to claim 1, wherein the mounting device comprises at least two, three, four or more fastening elements and an elastic element and a nut for each fastening element.

* * * * *